(12) United States Patent
Theil et al.

(10) Patent No.: US 8,098,058 B2
(45) Date of Patent: Jan. 17, 2012

(54) CIRCUIT ARRANGEMENT COMPRISING A LOAD TRANSISTOR AND A MEASURING TRANSISTOR

(75) Inventors: Aron Theil, Neufahrn (DE); Steffen Thiele, Munich (DE)

(73) Assignee: Infineon Technologies AG, Neubiberg (DE)

( * ) Notice: Subject to any disclaimer, the term of this patent is extended or adjusted under 35 U.S.C. 154(b) by 227 days.

(21) Appl. No.: 12/628,714

(22) Filed: Dec. 1, 2009

(65) Prior Publication Data

US 2010/0134086 A1    Jun. 3, 2010

(30) Foreign Application Priority Data

Dec. 1, 2008  (DE) .......................... 10 2008 059 853

(51) Int. Cl.
*G05F 1/573* (2006.01)
*G05F 3/26* (2006.01)
(52) U.S. Cl. .... 323/277; 323/316; 323/317; 324/762.09
(58) Field of Classification Search ................. 323/273, 323/274, 275, 276, 277, 279, 280, 315, 316, 323/317; 327/53, 541, 581; 324/762.09
See application file for complete search history.

(56) References Cited

U.S. PATENT DOCUMENTS

| 5,004,970 A * | 4/1991 | Barou ........................... 323/277 |
| 6,661,249 B2 * | 12/2003 | Oyrer ....................... 324/762.09 |
| 6,737,856 B2 * | 5/2004 | Sander ..................... 324/762.09 |
| 2002/0158654 A1 | 10/2002 | Graf |
| 2005/0013079 A1 | 1/2005 | Mitsuda |

FOREIGN PATENT DOCUMENTS

| DE | 10120524 | 11/2002 |
| DE | 102004032697 | 3/2005 |
| DE | 102004041886 | 3/2006 |

* cited by examiner

*Primary Examiner* — Gary L Laxton
(74) *Attorney, Agent, or Firm* — Dicke, Billig & Czaja, PLLC

(57) ABSTRACT

One aspect is a circuit arrangement having a load current path with a load transistor having a first and a second load path terminal and a control terminal. A first measurement current path includes a measuring transistor having a first and a second load path terminal and a control terminal. The control terminals and first load path terminals of the load transistor and the measuring transistor are coupled. A first regulating circuit has a controllable resistor and is designed to drive the resistor depending on electrical potentials at the second load path terminals of the load transistor and of the measuring transistor. A current mirror circuit is coupled between the first measurement current path and a second measurement current path. A deactivation circuit is designed to deactivate the first regulating circuit depending on a current flowing through the measuring transistor.

20 Claims, 9 Drawing Sheets

CIRCUIT ARRANGEMENT COMPRISING A LOAD TRANSISTOR AND A MEASURING TRANSISTOR

CROSS REFERENCE TO RELATED APPLICATIONS

This Utility Patent Application claims priority to German Patent Application No. DE 10 2008 059 853.4-35, filed on Dec. 1, 2008, and incorporated herein by reference.

BACKGROUND

The present invention relates to a circuit arrangement including a load transistor and a measuring transistor. In such a circuit arrangement, the measuring transistor serves for measuring a load current flowing through the load transistor. In this case, the measuring transistor is operated at the same operating point as the load transistor; a measurement current flowing through the measuring transistor is then directly proportional to a load current flowing through the load transistor. In this case, a proportionality factor between the measurement current and the load current is determined by a ratio between the active transistor area of the measuring transistor and the active transistor area of the load transistor.

For setting the operating point of the measuring transistor, a circuit arrangement of this type contains a regulating circuit having a measuring amplifier and a variable resistor connected in series with the measuring transistor. The measuring amplifier serves to detect a difference between electrical potentials at load path connections of the load transistor and of the measuring transistor and to readjust the resistance value of the resistor ideally in such a way that this potential difference is zero. If the measuring amplifier has a voltage offset, then this offset can adversely influence the setting of the operating point of the measuring amplifier, and thus the current measurement. The offset can have an adverse effect particularly in the case of small load currents, and thus in the case of small measurement currents.

For these and other reasons there is a need for the present invention.

SUMMARY

A first embodiment of the present disclosure relates to a circuit arrangement including: a load current path including a load transistor having a first and a second load path terminal and a control terminal; a first measurement current path including a measuring transistor having a first and a second load path terminal and a control terminal, the control terminal being coupled to the control terminal of the load transistor, and the first load path terminal being coupled to the first load path terminal of the load transistor; a first regulating circuit having a controllable resistor, and being designed to drive the resistor depending on electrical potentials at the second load path terminals of the load transistor and of the measuring transistor; a second measurement current path, and a current mirror circuit coupled between the first and the second measurement current path; a deactivation circuit adapted to deactivate the first regulating circuit depending on a current flowing through the measuring transistor.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Various examples are explained below with reference to drawings. The drawings serve for elucidating the basic principle, and so only the parts or component zones required for understanding the basic principle are illustrated. In the figures, unless indicated otherwise, identical reference symbols designate identical parts having the same meaning.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
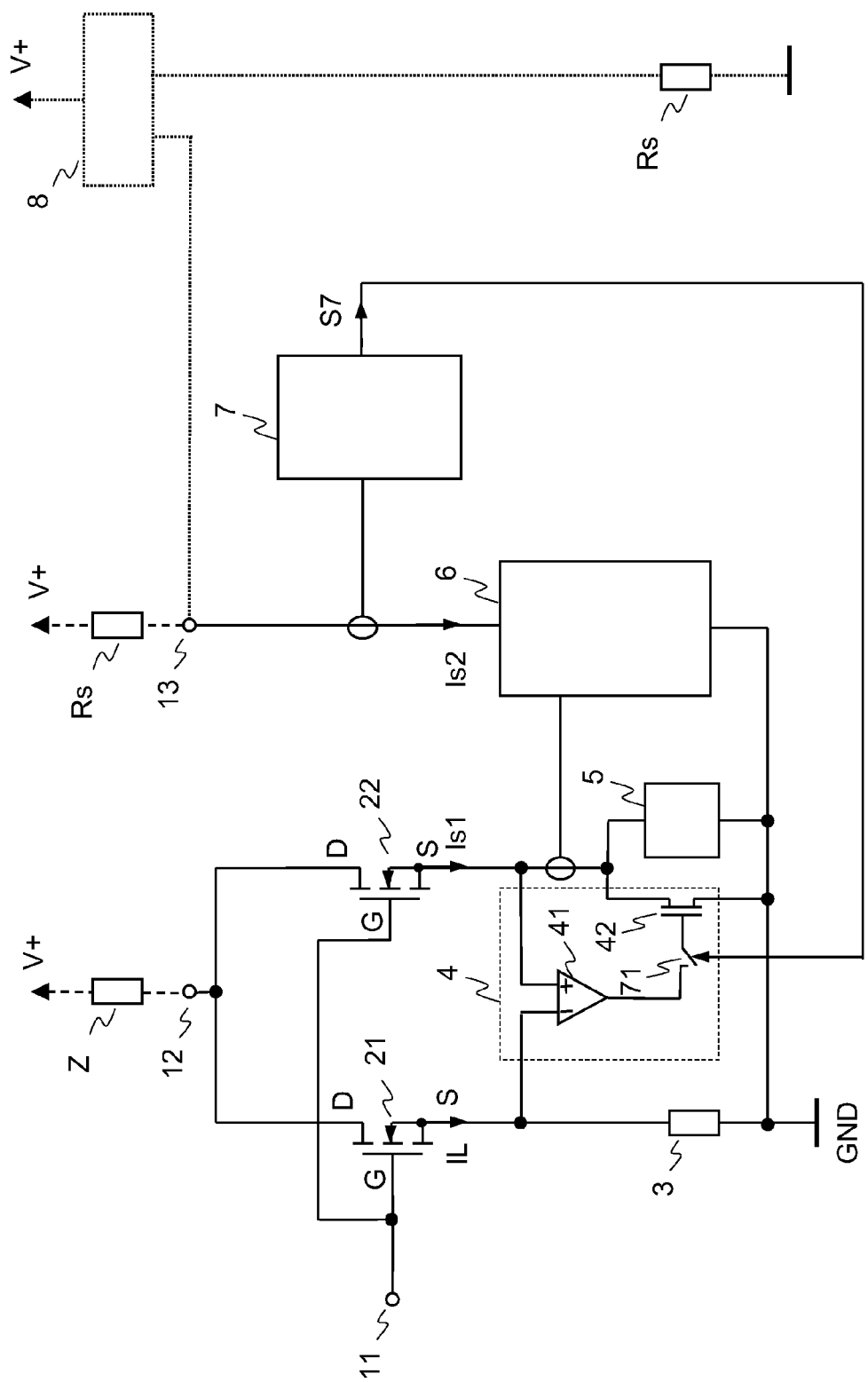
FIG. 1 illustrates a first example of a circuit arrangement including a load transistor, a measuring transistor, a regulating circuit, a current mirror circuit and a deactivation circuit for the regulating circuit.
Figure 2:
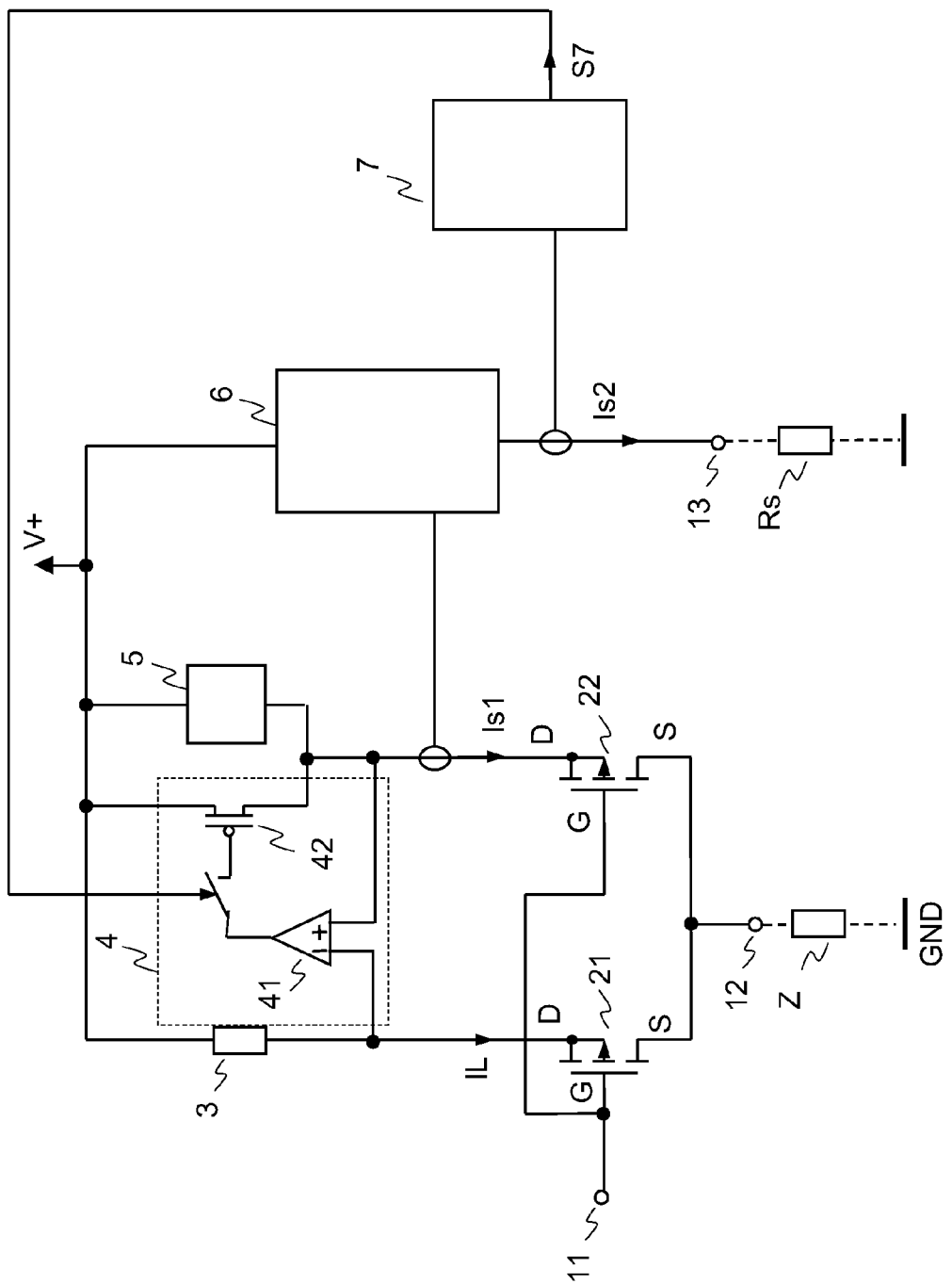
FIG. 2 illustrates a second example of a circuit arrangement including a load transistor, a measuring transistor, a regulating circuit, a deactivation circuit for the regulating circuit, and a current mirror circuit.

FIGS. 1 and 2 each show examples of a circuit arrangement having a load transistor 21 and a measuring transistor 22. The circuit arrangements illustrated in FIGS. 1 and 2 each have identical circuit blocks or circuit components, which are designated by identical reference symbols in these figures. The circuit arrangements illustrated in FIGS. 1 and 2 differ merely in that the load transistor 21 and the measuring transistor 22 are transistors of a first conduction type in the case of the circuit arrangement in accordance with FIG. 1 and transistors of a second conduction type in the case of the circuit arrangement in accordance with FIG. 2. Specifically, the load transistor 21 and the measuring transistor 22 are n-conducting MOSFETs in the case of the circuit arrangement illustrated in FIG. 1 and p-conducting MOSFETs in the case of the circuit arrangement in accordance with FIG. 2. The MOSFETs 21, 22 are normally off MOSFETs in the example. It should be pointed out that the use of normally off MOSFETs as load transistor 21 and measuring transistor 22 should be understood merely as an example, that normally on MOSFETs can also be used, and that, of course, bipolar transistors or IGBTs can also be used instead of MOSFETs.

The load transistor 21 and the measuring transistor 22 each have a control terminal and a first and a second load path terminal. In the case of the MOSFETs illustrated in FIGS. 1 and 2, their gate terminals G form the control terminals, their drain terminals D form the first load path terminals and their source terminals S form the second load path terminals. Load paths of the load transistor 21 and of the measuring transistor 22 in each case run between the first and the second load path terminal of the respective transistor.

The circuit arrangement illustrated can be used for the switching of an electrical load Z that can be connected to the load terminal 12. For this purpose the load path of the load transistor 21 is connected between a load terminal 12 of the circuit arrangement and a terminal for a first supply potential. The first supply potential is a negative supply potential GND or a reference potential, such as ground, for example, in the case of the circuit arrangement in accordance with FIG. 1 and a positive supply potential V+ in the case of the circuit arrangement in accordance with FIG. 2. The load Z is connected between the load terminal 12 and a terminal for a second supply potential (V+ in FIG. 1 and GND in FIG. 2).

The control terminal G of the load transistor 21 is connected to a drive input 11 of the circuit arrangement. The drive input 11 serves for feeding in a switching signal that drives the load transistor 21. For generating the switching signal, a conventional drive or driver circuit can be connected to the drive input 11 (not illustrated).

A load current resistance is present between the second load path terminal S of the load transistor 21 and the terminal for the first supply potential (GND in FIG. 1 and V+ in FIG. 2), the load current resistance being represented by a non-reactive resistance 3 in FIGS. 1 and 2. This load current resistance 3 results from bulk and lead resistances inevitably present between the terminal for the first supply potential and the second load path terminal S of the load transistor 21. The load transistor 21 can be integrated in a conventional manner in a semiconductor chip (die) arranged in a chip housing (not illustrated). In this case, contact can be made with the load transistor 21 in a known manner via connection pins of the chip housing and via bonding wires arranged between the connection pins and the semiconductor chip. The load current path resistance 3 illustrated in FIGS. 1 and 2 includes, in one embodiment, non-reactive resistances of metallizations, bonding wires and connection pins.

Corresponding load current path resistances are also present between the first load path terminal D of the load transistor 21 and the load terminal 12 of the circuit arrangement. However, these further load current path resistances are unimportant for the further consideration, and so they are not illustrated in the figures.

A circuit branch from the load terminal 12 via the load path of the load transistor 21 and the load current resistance 3 to the terminal for the first supply potential (GND and V+, respectively) is referred to hereinafter as the load current path of the circuit arrangement. During the operation of the circuit arrangement, a load current IL flows through the load current path when the load transistor 21 is driven in the on state. For various reasons it may be necessary to measure the load current IL. Such a current measurement can be used for example for regulating a current through the load Z or for limiting a current flowing through the load Z. In principle, a shunt resistor connected into the load current path could be used for current measurement. However, the use of such a shunt resistor for current measurement does result in power loss.

In the case of the circuit arrangement illustrated in FIGS. 1 and 2, the measuring transistor 22 serves for measuring the load current IL flowing through the load current path. For this purpose, the control terminal G of the measuring transistor 22 is coupled to the control terminal G of the load transistor 21, and the first load path terminal D of the measuring transistor 22 is coupled to the first load path terminal D of the load transistor 21 and thus to the load terminal 12 of the circuit arrangement. A current path from the load terminal 12 via the load path of the measuring transistor 22 is referred to hereinafter as the first measurement current path. A current Is1 flowing through this first measurement current path during the operation of the circuit arrangement is referred to hereinafter as the first measurement current.

If the load transistor 21 and the measuring transistor 22 are operated at the same operating point, then the load current flowing through the measuring transistor 22 is directly proportional to the load current IL flowing through the load transistor 21. In this case, a proportionality factor between the load current IL and the first measurement current Is1 corresponds to the ratio between the active transistor area of the load transistor 21 and the active transistor area of the measuring transistor 22. The load transistor 21 and the measuring transistor 22, in a manner not illustrated in more specific detail, can be integrated in a common semiconductor chip and can each have a number of transistor cells connected in parallel (not illustrated). The ratio between the number of transistor cells which the load transistor 21 has and the number of transistor cells which the measuring transistor 22 has then corresponds to the ratio between the active transistor areas or the ratio between the load current IL and the first measurement current Is1.

The circuit arrangement has a first regulating circuit 4, which is designed to regulate the operating point of the measuring transistor 22 depending on the operating point of the load transistor 21. The first regulating circuit 4 has a controllable resistor 42 and a measuring amplifier 41, which drives the controllable resistor 42. The task of the measuring amplifier 41 is to drive the controllable resistor 42, which, in the example illustrated, is connected in series with the load path of the measuring transistor 22, in such a way that a voltage difference between the electrical potentials at the second load path terminals S of the load transistor 21 and of the measuring transistor 22 is zero. If the voltage difference is zero, then the load transistor 21 and the measuring transistor 22 are at the same operating point. For this purpose, the first input of the measuring amplifier 41 is connected to the second load path terminal S of the load transistor 21, and the second input of the measuring amplifier 41 is connected to the load path terminal S of the measuring transistor 22. The first input of the measuring amplifier 41 is the inverting input of the measuring amplifier. Accordingly, the second input is the non-inverting input. This type of interconnection of the measuring amplifier 41 takes account of the type of variable resistor 42 used. In the examples illustrated, the variable resistor 42 is in each case a transistor, to be precise an n-conducting transistor, in one embodiment an n-MOSFET, in the case of the example in accordance with FIG. 1 and a p-conducting transistor, in one embodiment a p-MOSFET, in the case of the example in accordance with FIG. 2. The output of the measuring amplifier 41 is connected to the control input of the transistor 42, which is also referred to hereinafter as regulating transistor.

The regulating transistor 42 is controlled upward or regulated downward by the measuring amplifier 41 in each case to an extent such that the electrical potential at the second load path terminal S of the measuring transistor 22 corresponds to the electrical potential at the second load path terminal S of the load transistor 21. The load transistor 21 and the measuring transistor 22 are then at the same operating point.

In principle, the first measurement current Is1 could be detected directly by using a shunt resistor connected into the first measurement current path. In this case, however, the resistance value of the shunt resistor would have to be chosen such that the voltage drop across the shunt resistor is reliably smaller than the voltage drop across the load current path resistance 3 as governed by the load current IL. Since endeavors are made, in principle, to minimize the load current path resistance 3 in order to reduce the power loss arising in the circuit arrangement, the voltage drop in the load current resistance 3 is correspondingly small, which would then also be applicable to the measurement signal that can be tapped off at the shunt resistor. In order to be able to set the amplitude of a current measurement signal representing the first measurement current Is1, or the signal swing of such a current measurement signal for a given change in the load current IL, independently of the maximum voltage drop across the load current resistance 3, a current mirror circuit 6 is provided, which is coupled between the first measurement current path and a second measurement current path and which is designed to map the measurement current flowing in the first measurement current path Is1 onto a second measurement current Is2 flowing in second measurement current path. The second measurement current path runs from a measuring terminal 13 of the circuit arrangement via the current mirror circuit 6 to the terminal for the first supply potential (GND in the case of the circuit arrangement in accordance with FIG. 1 and V+ in the case of the circuit arrangement in accordance with FIG. 2). The current mirror circuit 6 can be a conventional current mirror circuit suitable for mapping the load current Is1 flowing in the first measurement current path onto the second measurement current Is2 flowing in the second measurement current path. The mapping ratio of the current mirror circuit 6 can be 1:1. In this case, the second measurement current Is2 corresponds to the first measurement current Is1. However, the mapping ratio or current mirror ratio can also differ from 1:1. In this case, the second measurement current Is2 is proportional to the first measurement current Is1 by way of the mapping ratio or current mirror ratio of the current mirror 6.

A current measuring resistor Rs can be connected between the measuring terminal 13 and the terminal for the second supply potential (V+ in the case of the circuit in accordance with FIG. 1 and GND in the case of the circuit in accordance with FIG. 2). A voltage drop across the current measuring resistor Rs is—by way of the resistance value of the measuring resistor as proportionality factor—directly proportional to the second measurement current Is2 and—by way of the mapping ratio of the current mirror circuit 6—directly proportional to the first measurement current Is1.

The measurement voltage or the current measurement signal is a voltage relative to reference potential GND in the case of the circuit in accordance with FIG. 2, and a voltage relative to the positive supply potential V+ in the case of the circuit in accordance with FIG. 1. Instead of connecting the measuring resistor Rs directly between the measuring terminal 13 and the positive supply potential V+ in the case of the circuit in accordance with FIG. 1, there is also the possibility of connecting a further current mirror circuit to the measuring terminal 13, which further current mirror circuit maps or mirrors the second measurement current Is2 onto a current measuring resistor connected to reference potential GND. This variant is illustrated by dotted lines in FIG. 1. In FIG. 1 the reference symbol 8 designates the further current mirror circuit.

The circuit arrangement additionally has a deactivation circuit 7, which is designed to deactivate the first regulating circuit 4 depending on the first measurement current Is1, flowing through the measuring transistor 22, when the measurement current Is1 falls below a predefined current threshold value. For this purpose, the deactivation circuit 7 evaluates the second measurement current Is2, for example, which is directly related to the first measurement current Is1 in the manner explained. The deactivation circuit 7 generates a deactivation signal S7, which assumes a first or a second signal level depending on whether the first measurement current Is1 lies below the current threshold value. The first regulating circuit 4 is deactivated by the deactivation signal S7.

The deactivation of the first regulating circuit 4 by the deactivation signal S7 can be effected in any desired manner. Thus, by way of example, there is a possibility of interrupting, depending on the deactivation signal S7, the line connection between the measuring amplifier 41 and the variable resistor driven by the measuring amplifier 41, as is illustrated schematically in FIGS. 1 and 2. In one embodiment, a switch could be connected in series with the variable resistor 42, which is interrupted by the deactivation signal S7 if the first measurement current Is1 falls below the predefined threshold value.

In order to prevent the interruption of the current path into the first measurement current path when the regulating circuit 4 is deactivated, a bridging circuit 5 is provided in parallel with the variable resistor 42, the bridging circuit being designed to accept the measurement current Is1 flowing through the first measurement current path when the regulating circuit 4 is deactivated.

Possible examples of the bridging circuit 5, of the current mirror circuit 6 and of the deactivation circuit 7 are explained below. The circuit examples explained below are based—with the exception of the example in FIG. 7—on the circuit arrangement in accordance with FIG. 2, wherein the load transistor 21 and the measuring transistor are realized as n-channel MOSFETs. The examples explained below are also applicable in a corresponding manner to the basic circuit in accordance with FIG. 1, wherein the load transistor 21 and the measuring transistor 22 are p-channel MOSFETs. In this case, the supply potential terminals have to be interchanged and the n-MOSFETs explained in the examples below have to be respectively replaced by p-MOSFETs.

Figure 3:
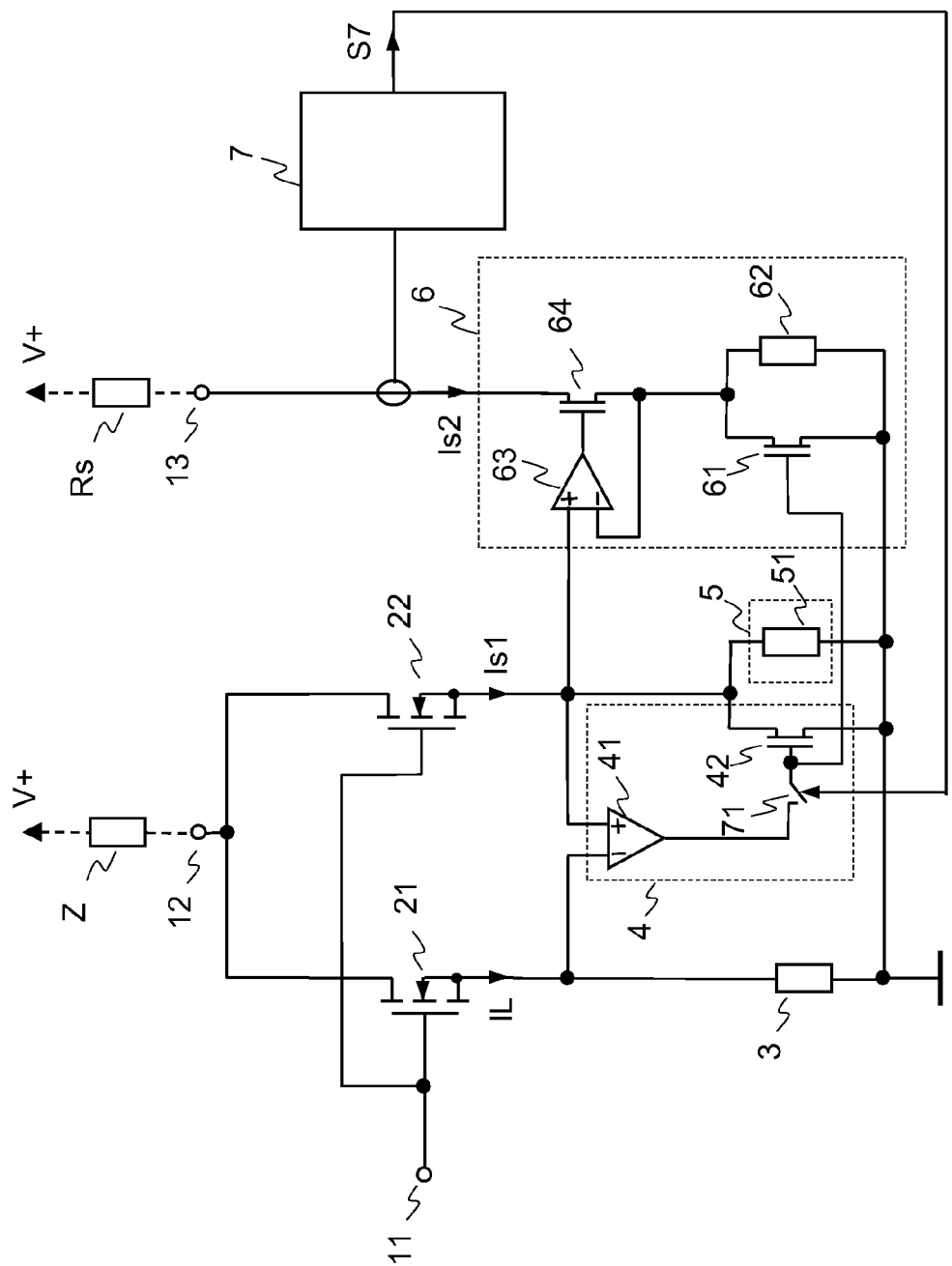
FIG. 3 illustrates a first implementation example of the current mirror circuit.

In the case of the example illustrated in FIG. 3, the bridging circuit 5 has a non-reactive resistor 51, which is permanently connected in parallel with the variable resistor 42 of the first regulating circuit 4. The following holds true for a resistance value R51 of the resistor, for example:

$$R51 > k \cdot R3 \quad (1).$$

In this case, R3 denotes the resistance value of the load current path resistance 3, and k denotes the ratio between the active transistor area of the load transistor 21 and the active transistor area of the measuring transistor 22. This dimensioning of the bridging resistor 51 ensures that the operating point of the measuring transistor 22 can be adjusted to the operating point of the load transistor 21 during the normal operation of the circuit arrangement.

In a manner corresponding to the load current path resistance 3, a non-reactive resistance can likewise be present (not illustrated) in series with the load path of the regulating transistor 42, the resistance being formed for example by metallizations, bonding wires or connection pins. The abovementioned regulation of the operating point of the measuring transistor 22 functions provided that a resistance value of the resistance is less than k times the load current path resistance 3, that is to say is less than k·R3. This condition can easily be met, such that no further explanations are necessary in this respect.

In the case of this circuit arrangement, the current mirror circuit 6 has a current mirror transistor 61, which is driven by the regulating amplifier 41 in a manner corresponding to the regulating transistor 42. The regulating transistor 42 and the current mirror transistor 61 can be dimensioned identically. In this case, the same current as flows through the regulating transistor 42 flows through the current mirror transistor 61 when the first regulating circuit 4 is activated. A non-reactive resistor 62 is connected in parallel with the current mirror transistor 61, such that the same circuit structure as is present in the first measurement current path as a result of the parallel connection of the regulating transistor 42 and the bridging resistor 51 is present in the current mirror circuit 6.

The resistor 62 connected in parallel with the current mirror transistor 61 is referred to hereinafter as the current mirror resistor. A resistance value of the current mirror resistor 62 can be chosen such that it corresponds at least approximately to the resistance value of the bridging resistor 51, to be precise when the regulating transistor 42 and the current mirror transistor 61 are dimensioned identically. If the regulating transistor 42 and the current mirror transistor 61 are dimensioned identically, then a current flowing through the regulating transistor 42 corresponds to a current flowing through the current mirror transistor 61 if the first regulating circuit 4 is activated. A second regulating circuit 63, 64 is provided for regulating a current through the current mirror resistor 62. The second regulating circuit has a measuring amplifier 63 and a variable resistor 64, which is driven by the measuring amplifier 63 and which is realized as a transistor in the example. The measuring amplifier 63 compares the electrical potentials at those terminals of the bridging resistor 51 and of the current mirror resistor 62 which are remote from the first supply potential GND and, via the regulating transistor 64, adjusts the voltage drop across the current mirror resistor 62 in such a way that it corresponds to the voltage drop across the bridging resistor 51. If the bridging resistor 51 and the current mirror resistor 62 are dimensioned approximately identically, then the current flowing through the current mirror resistor 62 corresponds at least approximately to the current flowing through the bridging resistor 51. The second measurement current Is1 flowing in the second measurement current path then corresponds at least approximately to the first measurement current Is1. In this arrangement, the parallel connection including current mirror transistor 61 and the current mirror resistor 62 is connected up in series with the regulating transistor 64 in the second measurement current path.

The regulating transistor and the current mirror transistor need not necessarily be dimensioned identically, but rather can be dimensioned differently, in which case the dimensioning of the bridging resistor 51 and of the current mirror resistor 62 should be adapted to the dimensioning of the regulating transistor 42 and of the current mirror transistor 61. If the regulating transistor 42 and the current mirror transistor 61 are dimensioned for example in such a way that, for a given drive voltage, the ratio between a current through the regulating transistor 41 and a current through the current mirror transistor 61 is 1:n, then the resistance value of the current mirror resistor 62 should be adapted to the resistance value of the bridging resistor 51 in such a way that, given an identical voltage drop across these resistors, a ratio between a current through the bridging resistor 51 and a current through the current mirror resistor 61 is likewise 1:n. The ratio between the second and the first measurement current Is1, Is2 is then likewise 1:n. Such a current ratio can be achieved if the active transistor area of the current mirror transistor 61 amounts to n times the active transistor area of the regulating transistor 41 and if the resistance value of the current mirror resistor 62 amounts to 1/n times the resistance value of the regulating transistor 41.

The measuring amplifier 63 of the second regulating circuit 63, 64 can exhibit an offset. In this case, the measuring amplifier does not regulate the voltages V51, V62 across the bridging resistor 51 and the current mirror resistor to the same voltage value, but rather in such a way that there is a voltage difference between these voltages. This voltage difference corresponds to an offset voltage of the measuring amplifier 63. This voltage difference has the effect that currents which flow through the bridging resistor 51 and the current mirror resistor are currents which are not related exactly to one another in the ratio of the resistance values of the resistors 51, 62. As a result, the first and the second measurement current Is1, Is2 likewise are not in the desired ratio to one another given by the dimensionings of the transistors 42, 61 and resistors 51, 62. An adverse influence of the offset, which can be a few mV, on the current measurement is all the greater, the smaller the voltage drop across the current mirror resistor 62, that is to say the smaller the measurement currents Is1, Is2.

If, in the case of the circuit arrangement illustrated in FIG. 3, the second measurement current Is2 falls below a predefined threshold value, then the deactivation circuit 7 deactivates the first regulating circuit 4 with the regulating transistor 42 and thus also the current mirror transistor 61. The first measurement current Is1 is then accepted by the bridging resistor 51, and the current mirror resistor 62 accepts the second measurement current Is2. The voltage V62 across the current mirror resistor 62 thereby rises, as a result of which the effects of a voltage offset of the measuring amplifier 63 on the current through the current mirror resistor 62 are reduced. Since, when the first regulating circuit 4 is deactivated, the measuring transistor 22 is no longer operated at the same operating point as the load transistor 21, the above-explained proportionality between first measurement current Is1 and load current IL is no longer applicable when the first regulating circuit 4 is deactivated. The error caused by the lack of regulation of the operating points in the case of small load currents is lower, however, than the error or the uncertainty regarding the measurement result that is caused by the offset of the amplifier 63 in the case of small load currents.

A turn-off of the regulating circuit 42, and thus also of the current mirror transistor 61, has the effect of increasing the resistance connected in series with the measuring transistor 22 and the resistance connected in series with the second regulating transistor 64, to be precise as a result of the turn-off of one of the branches of the parallel connections including the regulating transistor 42 and the bridging resistor 51 in one instance and including the current mirror transistor 61 and the current mirror resistor 62 in the other instance.

In the case of the embodiments explained above, the deactivation circuit 7 evaluates the second measurement current Is2 in order thereby to determine the first measurement current Is1 flowing through the measuring transistor 22 and thereby to generate the deactivation signal S7 depending on the first measurement current Is1. The determination of the second measurement current Is2 by the deactivation circuit 7 can be effected in any conventional manner. For this purpose, the measurement signal available at the measuring input 13 can be fed to the deactivation circuit 7. In one embodiment, there is the possibility of providing a shunt resistor in the second measurement current path, detecting the voltage across the shunt resistor and feeding the voltage thus obtained to the deactivation circuit 7.

Figure 4:
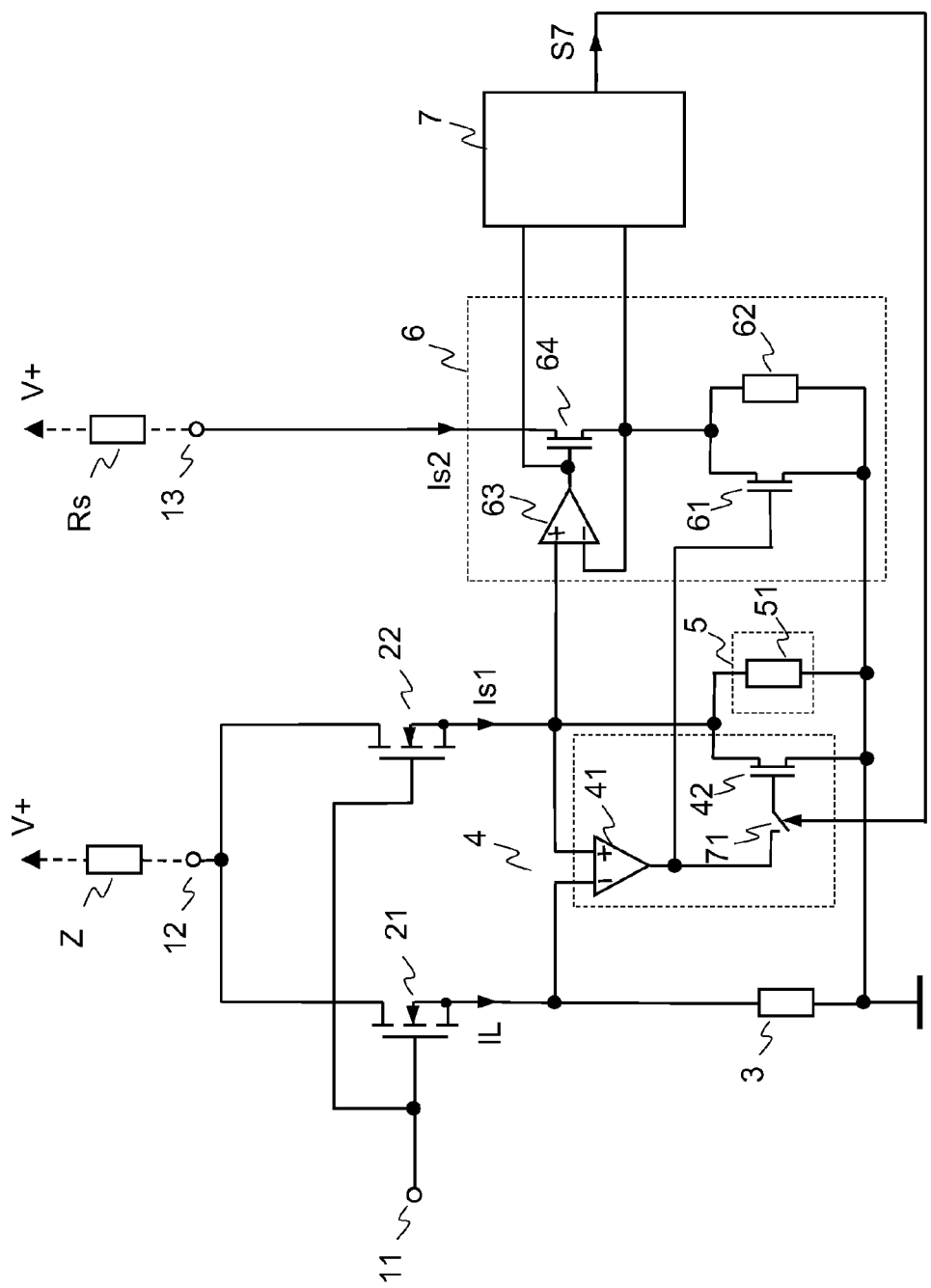
FIG. 4 illustrates a first example of the deactivation circuit.

With the provision of a current mirror circuit 6 such as has been explained with reference to FIG. 3, there is also the possibility, referring to FIG. 4, of feeding the drive voltage of the regulating transistor 64 of the second regulating circuit 63, 64 as input signal to the deactivation circuit 7. The second measurement current Is2 flowing through the regulating transistor 64 is directly dependent on the drive voltage of the transistor by way of the transistor characteristic curve of the transistor. An evaluation of the drive voltage thus makes it possible to directly evaluate the second measurement current Is2. In order to evaluate whether the second measurement current Is2 falls below a predefined threshold value, it is merely necessary in this case to evaluate whether the drive voltage falls below a predefined voltage threshold value related to the current threshold value by way of the transistor characteristic curve of the regulating transistor 64.

Figure 5:
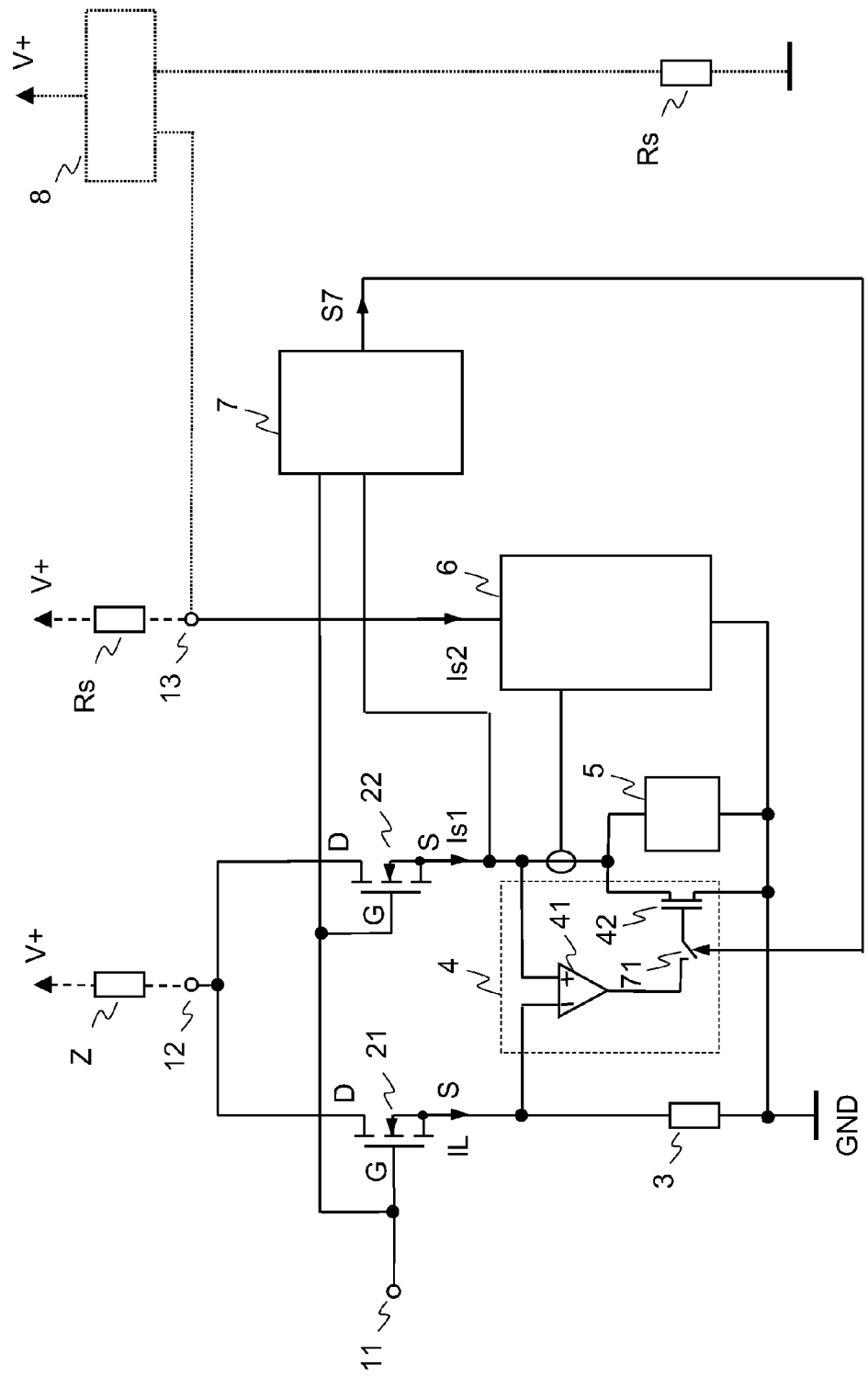
FIG. 5 illustrates a second example of the deactivation circuit.

Referring to FIG. 5, in a further example for determining the current flowing through the first measuring transistor Is1, the drive voltage, that is to say in the example illustrated the gate-source voltage, of the second measuring transistor 22 can be fed as input signal to the deactivation circuit 7. In this case, the first measurement current Is1 flowing through the measuring transistor 22 is directly related to the drive voltage by way of the transistor characteristic curve of the measuring transistor 22. In this example, the deactivation circuit 7 is designed to deactivate the first regulating amplifier 4 by using the deactivation signal S7 if the drive voltage of the measuring transistor 22 falls below a predefined voltage threshold value related to the current threshold value of the first measurement current Is1 by way of the transistor characteristic curve of the measuring transistor 22.

Figure 6:
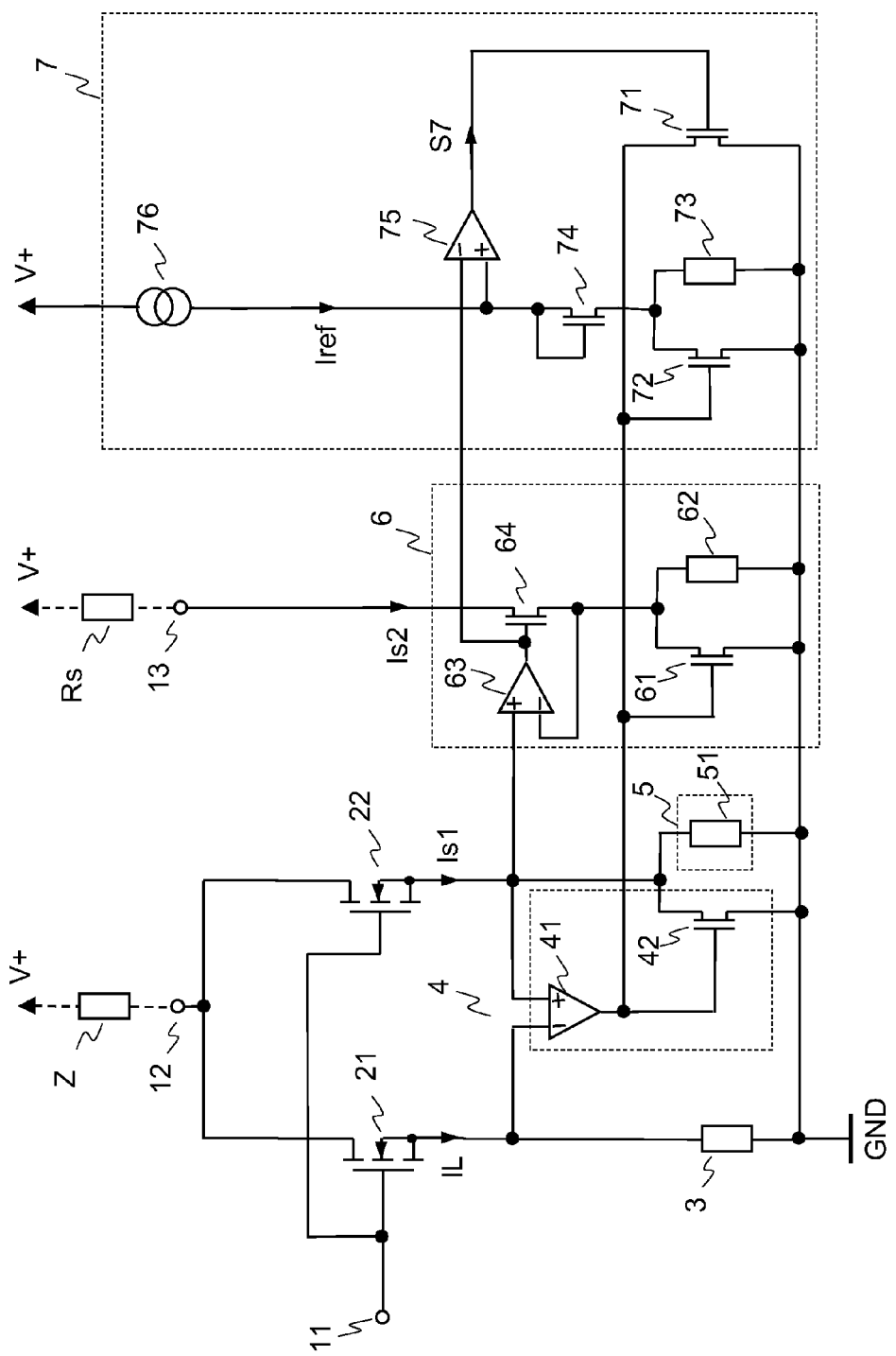
FIG. 6 illustrates in detail circuit blocks of the circuit arrangement illustrated in FIG. 1.

A further example of a deactivation circuit 7 is illustrated in FIG. 6. This deactivation circuit is constructed similarly to the current mirror circuit 6 explained with reference to FIG. 4 and has a first transistor 72, which is driven by the regulating amplifier 41 of the first regulating circuit 4, and also a first resistor 73 connected in parallel with the first transistor 72. The first transistor 72 is dimensioned in a manner corresponding to the current mirror transistor 61, for example, and the first resistor 73 is dimensioned in a manner corresponding to the current mirror resistor 62, for example. However, the transistors 72, 61 and the resistors 73, 62 can also be dimensioned differently, in which case the dimensioning should be effected such that generally the active transistor areas of the transistors 61, 72 are in the ratio 1:m and the resistance values of the resistors 62, 73 are in the ratio m:1 with respect to one another, such that the currents through the transistors 61, 72 are in the same ratio with respect to one another as the currents through the resistors 62, 73.

A current source 76 is connected in series with the parallel connection including the first transistor 72 and the first resistor 73, the current source supplying a reference current Iref. A load 74 is connected in series with the current source 76 and the parallel connection including the first transistor 72 and the first resistor 73, the load being realized in the example as a second transistor 74—of a type identical to the second regulating transistor 64—which is connected up as a diode by virtue of its drain terminal being connected to its gate terminal The deactivation circuit 7 additionally has a comparator 75, which compares the electrical potentials at the control terminal of the regulating transistor 64 of the second regulating circuit 63, 64 and at the gate terminal of the second transistor 74 and which generates the deactivation signal S7 depending on this comparison. For deactivating the first regulating circuit 4, a third transistor 71 is provided in the example illustrated, the third transistor being connected between the output of the measuring amplifier 41 and the first supply potential GND. The third transistor 71 is driven in the on state or in the off state by the deactivation signal S7. In the on state, the third transistor 71 sets the drive voltage of the regulating transistor 42 to zero and thereby deactivates the first regulating circuit 4. In a corresponding manner, the third transistor 71 driven in the on state also deactivates the current mirror transistor 61 and the first transistor 72 of the deactivation circuit 7.

In the case of the deactivation circuit illustrated in FIG. 6, the deactivation signal S7 is generated in such a way that a deactivation level of the deactivation signal S7 corresponds to a high level. In the example illustrated, such a deactivation level of the deactivation signal S7 is generated by the comparator 75 when the electrical potential at the control terminal of the third transistor 74 rises above the value of the electrical potential at the control terminal of the regulating transistor 64. This is respectively the case when the second measurement current Is2 falls below the value of the reference current Iref or when the second measurement current Is2 falls below a value corresponding to 1/m times the reference current Iref, if the dimensioning generally explained above holds true for the transistors 61, 72 and the resistors 62, 73.

Instead of comparing the electrical potentials at the drive terminals of the regulating transistor 64 and of the third transistor 74, in one embodiment there is also the possibility of comparing the electrical potentials at circuit nodes in the second measurement current path of the deactivation circuit which lie between the regulating transistor 64 and the parallel connection including the current mirror transistor 61 and the current mirror resistor 62 in one instance and the second transistor 74 and the parallel circuit including the first transistor 72 and the first resistor 73 of the deactivation circuit 7.

Figure 7:
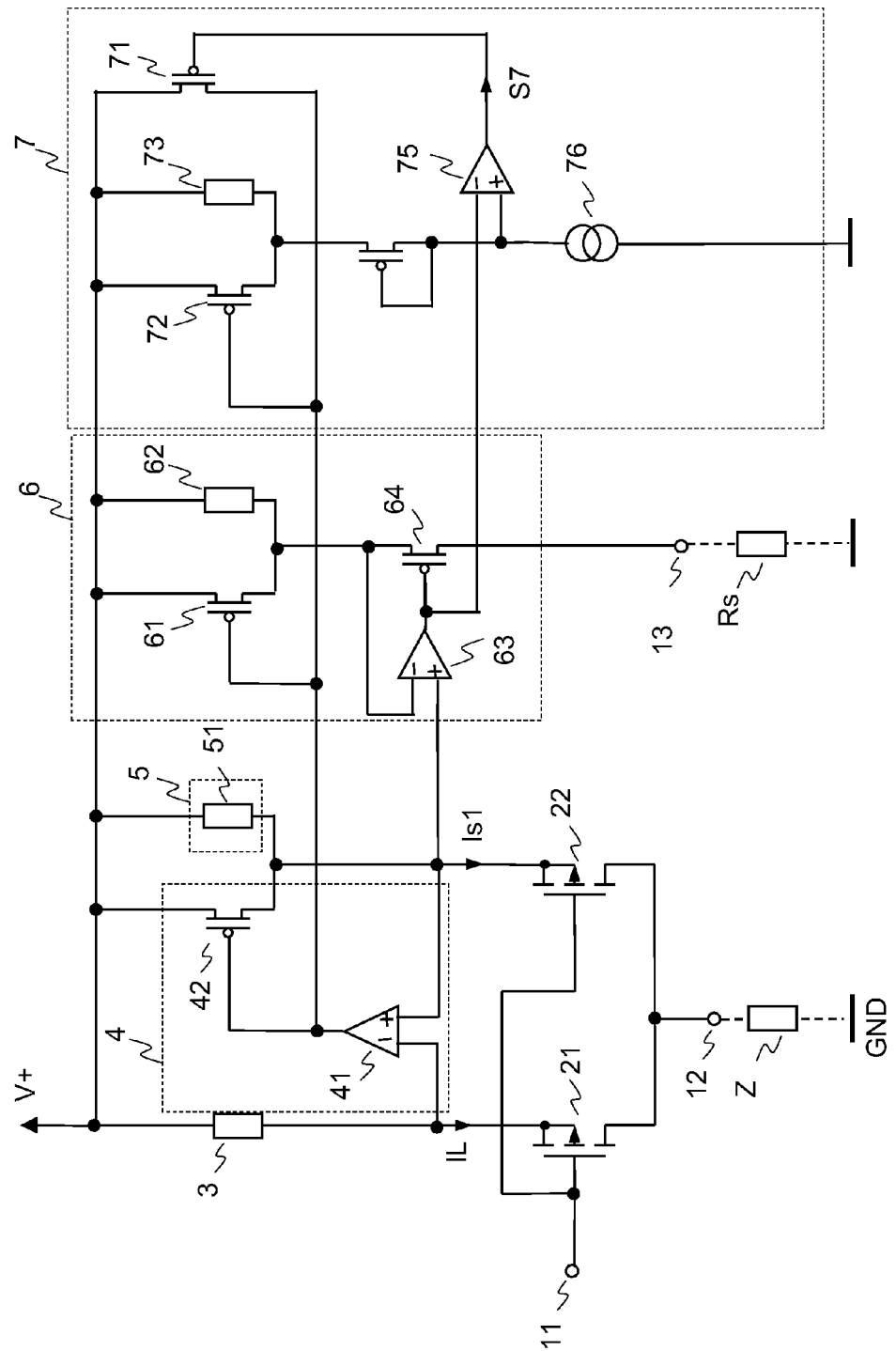
FIG. 7 illustrates in detail circuit blocks of the circuit arrangement illustrated in FIG. 2.

FIG. 7 illustrates a current mirror circuit 6 and also a deactivation circuit 7, such as has been explained with reference to FIG. 6, for the basic circuit in accordance with FIG. 2, wherein the load transistor 21 and the measuring transistor 22 are in each case p-channel MOSFETs. The explanations given above for the example in accordance with FIG. 6 are correspondingly applicable to the example in accordance with FIG. 7.

Figure 8:
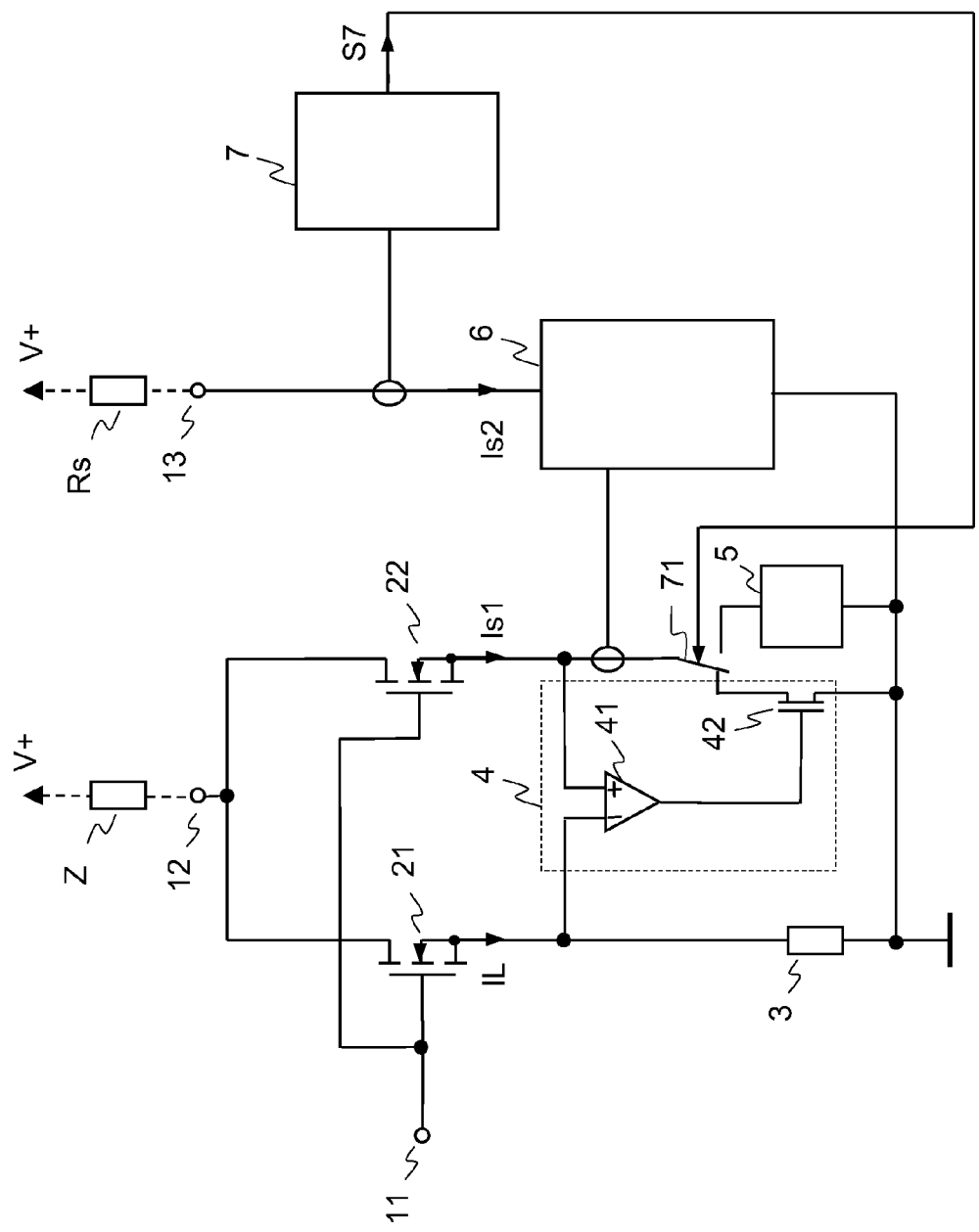
FIG. 8 illustrates a further example of the deactivation circuit.

FIG. 8 illustrates an example of a circuit arrangement in which a changeover switch 71 is provided for deactivating the first regulating circuit 4, which changeover switch, depending on the deactivation signal S7, effects changeover in such a way that the first measurement current Is1 flows through the controllable resistor 42 when the first regulating circuit 4 is activated, and flows via the bridging circuit 5 when the first regulated circuit 4 is deactivated. The bridging circuit 5 has a nonreactive resistor, for example, in accordance with the explanations concerning FIG. 3. The current mirror circuit 6 and the deactivation circuit 7 can be realized in accordance with the previous explanations. If this current mirror circuit 6 and the deactivation circuit 7 are realized in accordance with the explanations concerning FIG. 6, then a changeover switch controlled by the deactivation signal S7 can likewise be provided in the current mirror circuit 6 and the deactivation circuit 7, to be precise between the current mirror transistor 61 and the current mirror resistor 62 in the current mirror circuit 6, and between the first transistor 72 and the first resistor 73 in the deactivation circuit 7.

Figure 9:
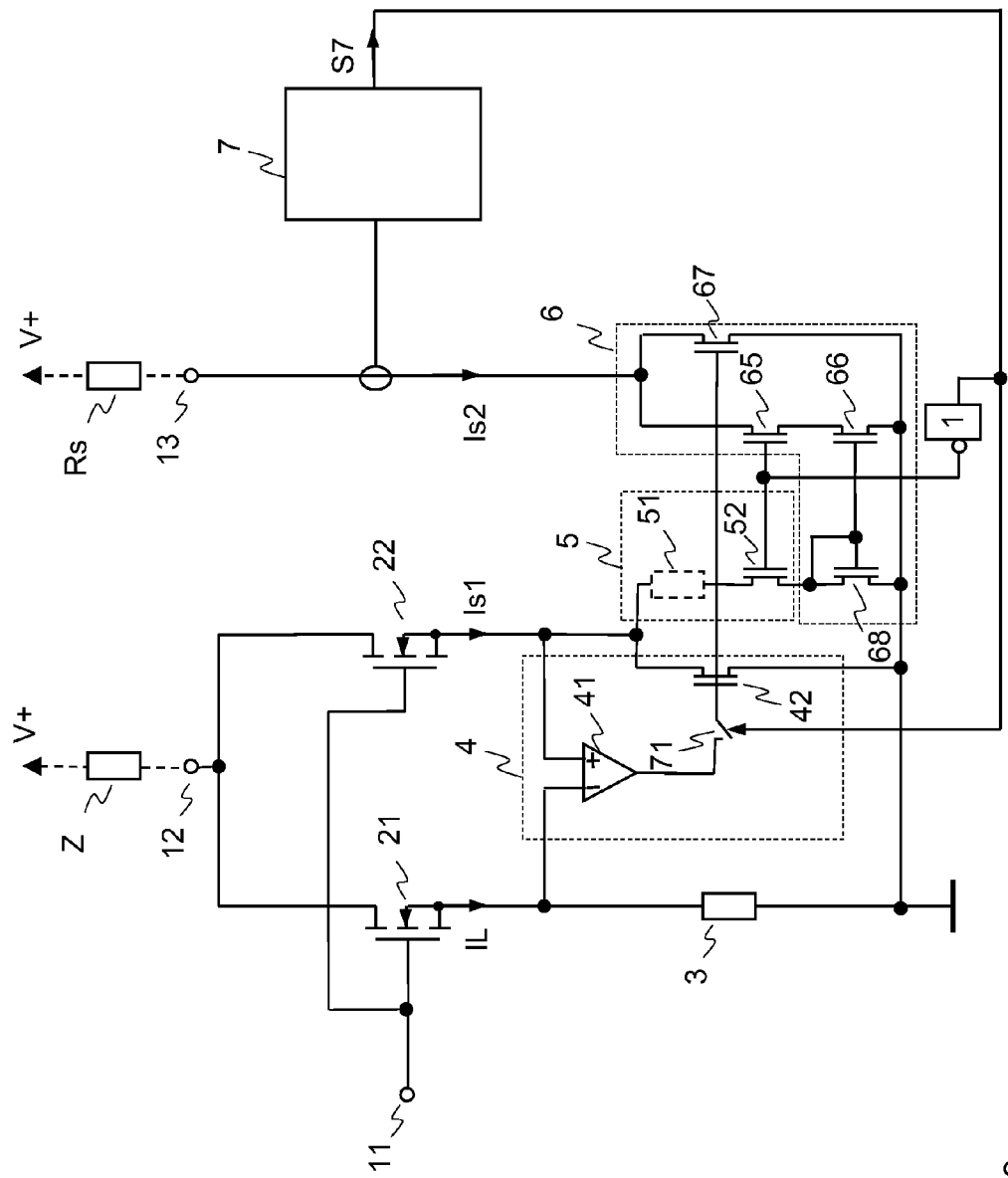
FIG. 9 illustrates an example of a bridging circuit and a current measuring arrangement.

FIG. 9 illustrates an example of a circuit arrangement in which a changeover is made between the regulating transistor 42 and the bridging circuit 5 depending on the deactivation signal S7. In this example, the bridging circuit 5 has a switch 52, which is realized as a transistor in the example and which is connected in series with a bridging resistor 51 optionally present. The switch 52 and a switch for deactivating the regulating circuit 4 are driven complementarily to one another by the deactivation signal S7, such that when the first regulating circuit 4 is deactivated, the switch 52 is switched on and the bridging current path is thus activated. In the example, an inverter serves for driving the switch 52 of the bridging circuit 5, the deactivation signal S7 being fed to the inverter as input signal. The switch 71 for deactivating the first regulating circuit 4 can be realized by a transistor in accordance with the explanations concerning FIG. 6.

In this example, the current mirror circuit 6 includes a first current mirror transistor 67, which is driven by using the measuring amplifier 41 in a manner corresponding to the regulating transistor 42. The first current mirror transistor 67 is dimensioned in one embodiment in a manner corresponding to the regulating transistor 42, such that when the first regulating circuit 4 is activated, the same current as flows through the regulating transistor 42 flows through the first current mirror transistor 67. The current mirror circuit 6 additionally includes a current mirror having a second and a third current mirror transistor 68, 66. In this case, the second current mirror transistor 68 is connected in series with the bridging circuit 5 and serves, when the bridging circuit 5 is activated, to map the current flowing through the bridging circuit 5 onto the third current mirror transistor 66, which is connected in parallel with the first current mirror transistor 67. A further switch 65 is optionally connected in series with the third current mirror transistor 66, the further switch being driven in a manner corresponding to the switch 52 in the bridging circuit 5. The further switch 65 can also be dispensed with since, with switch 52 deactivated in the bridging circuit 5, a current does not flow through the second current mirror transistor, such that no current flows through the third current mirror transistor 66 either. The parallel connection including the first and third current mirror transistors 67, 66 of the current mirror circuit 6 is connected between the measuring input 13 and the first supply potential GND.

It is to be understood that the features of the various exemplary embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement comprising:
   a load current path comprising a load transistor having a first and a second load path terminal and a control terminal;
   a first measurement current path comprising a measuring transistor having a first and a second load path terminal and a control terminal, the control terminal being coupled to the control terminal of the load transistor and the first load path terminal being coupled to the first load path terminal of the load transistor;
   a first regulating circuit having a controllable resistor and being adapted to drive the resistor depending on electrical potentials at the second load path terminals of the load transistor and of the measuring transistor;
   a second measurement current path, and a current mirror circuit coupled between the first and the second measurement current path;
   a deactivation circuit being adapted to deactivate the first regulating circuit depending on a current flowing through the measuring transistor.

2. The circuit arrangement of claim 1, wherein the second load path terminal of the load transistor is connected to a terminal for a first supply potential via a load current path resistance.

3. The circuit arrangement of claim 1, wherein the controllable resistor is connected between the second load path terminal of the measuring transistor and a terminal for a first supply potential.

4. The circuit arrangement of claim 3 further comprising a bridging circuit connected in parallel with the controllable resistor.

5. The circuit arrangement of claim 4, wherein the bridging circuit has a first resistor, which is permanently connected in parallel with the controllable resistor.

6. The circuit arrangement of claim 4, wherein the bridging circuit has a first resistor, which is adapted to be connected in parallel with the controllable resistor in a manner controlled by the deactivation circuit.

7. The circuit arrangement of claim 1, wherein the deactivation circuit is adapted to deactivate the first regulating circuit if a current flowing through the measuring transistor falls below a predefined threshold value.

8. The circuit arrangement of claim 1, wherein the deactivation circuit is adapted to detect a current flowing through the measuring transistor on the basis of a current flowing through the second measurement current path.

9. The circuit arrangement of claim 1, wherein the deactivation circuit is adapted to detect a current flowing through the measuring transistor on the basis of a drive voltage of the measuring transistor.

10. The circuit arrangement of claim 1, wherein the current mirror circuit comprises a second regulating circuit comprising a further controllable resistor connected into the second measurement current path.

11. The circuit arrangement of claim 10, wherein the controllable resistor is a transistor, and wherein the deactivation circuit is adapted to detect a current flowing through the measuring transistor on the basis of a drive voltage of the transistor.

12. An integrated circuit comprising:
    a load transistor comprising a first and a second load terminal and a control terminal;
    a measuring transistor comprising a first and a second load terminal and a control terminal, wherein the control terminals of the load and measuring transistors are coupled and the first load terminals of the load and measuring transistors are coupled;
    a first regulating circuit comprising a controllable resistor, the first regulating circuit driving the resistor depending on electrical potentials at the second load terminals of the load and measuring transistors;
    a current mirror circuit coupled between a measurement terminal and the measuring transistor; and
    deactivation means for deactivating the first regulating circuit depending on a current flowing through the measuring transistor.

13. The circuit arrangement of claim 12, wherein the second load terminal of the load transistor is connected to a terminal for a first supply potential via a load current path resistance.

14. The circuit arrangement of claim 12, wherein the controllable resistor is connected between the second load terminal of the measuring transistor and a terminal for a first supply potential.

15. The circuit arrangement as claimed in claim 12 further comprising a bridging circuit connected in parallel with the controllable resistor.

16. A method of controlling a circuit arrangement comprising:
providing a load current path comprising a load transistor having a first and a second load path terminal and a control terminal;
providing a first measurement current path comprising a measuring transistor having a first and a second load path terminal and a control terminal;
coupling the control terminal of the measuring transistor to the control terminal of the load transistor and the first load path terminal of the measuring transistor to the first load path terminal of the load transistor;
driving a controllable resistor in a regulating circuit depending on electrical potentials at the second load path terminals of the load transistor and of the measuring transistor;
mirroring the current from the first measurement current path into a second measurement current path with a current mirror circuit; and
deactivating the first regulating circuit depending on a current flowing through the measuring transistor.

17. The method of claim 16 further comprising connecting the second load path terminal of the load transistor to a terminal for a first supply potential via a load current path resistance.

18. The method of claim 16 further comprising connecting the controllable resistor between the second load path terminal of the measuring transistor and a terminal for a first supply potential.

19. The method of claim 16 further comprising connecting a bridging circuit in parallel with the controllable resistor.

20. The method of claim 19 further comprising permanently connecting a first resistor of the bridging circuit in parallel with the controllable resistor.

* * * * *